United States Patent
Liu et al.

(10) Patent No.: US 6,610,611 B2
(45) Date of Patent: Aug. 26, 2003

(54) METHOD OF REMOVING DIAMOND COATING AND METHOD OF MANUFACTURING DIAMOND-COATED BODY

(75) Inventors: Hao Liu, Toyokawa (JP); Hiroyuki Hanyu, Toyokawa (JP); Masahiro Tanaka, Toyokawa (JP)

(73) Assignee: OSG Corporation, Toyokawa (JP)

( * ) Notice: Subject to any disclaimer, the term of this patent is extended or adjusted under 35 U.S.C. 154(b) by 162 days.

(21) Appl. No.: 09/822,425

(22) Filed: Apr. 2, 2001

(65) Prior Publication Data

US 2001/0028919 A1 Oct. 11, 2001

(30) Foreign Application Priority Data

Apr. 11, 2000 (JP) ........................................ 2000-109484

(51) Int. Cl.[7] ........................... H01L 21/31; C23C 16/26
(52) U.S. Cl. .................... 438/758; 427/249.8; 427/553; 431/2; 431/3
(58) Field of Search ......................... 438/758; 427/226, 427/249.8, 553; 431/2, 3; 428/408

(56) References Cited

U.S. PATENT DOCUMENTS

| | | | | |
|---|---|---|---|---|
| 5,310,512 A | * | 5/1994 | Bigelow | 264/25 |
| 5,840,426 A | * | 11/1998 | Smentkowski et al. | 428/408 |
| 6,083,354 A | * | 7/2000 | Deguchi et al. | 204/157.15 |
| 6,365,230 B1 | * | 4/2002 | Baik et al. | 427/249.8 |
| 2002/0094379 A1 | * | 7/2002 | Sung | 427/249.8 |

FOREIGN PATENT DOCUMENTS

| | | |
|---|---|---|
| JP | 59-27753 B2 | 7/1984 |
| JP | 5-339758 | 12/1993 |
| JP | 2519037 B2 | 5/1996 |
| JP | 10-284657 | 10/1998 |

* cited by examiner

Primary Examiner—Alexander Ghyka
(74) Attorney, Agent, or Firm—Oliff & Berridge, PLC

(57) ABSTRACT

A method of removing a diamond coating from a substrate of a diamond-coated body which includes the substrate coated with the diamond coating. The method includes a step of heating the diamond-coated body at a predetermined temperature in a reactor at a predetermined reduced pressure, while introducing an oxygen gas into the reactor at a predetermined flow rate, for burning the diamond coating to thereby remove the diamond coating from the substrate.

10 Claims, 4 Drawing Sheets

METHOD OF REMOVING DIAMOND COATING AND METHOD OF MANUFACTURING DIAMOND-COATED BODY

BACKGROUND OF THE INVENTION

1. Field of the Invention

The present invention relates in general to a method of removing a diamond coating from a diamond-coated body, and a method of manufacturing a diamond-coated body by reutilizing a substrate from which the diamond coating has been removed.

2. Discussion of the Related Art

There is known a diamond-coated body, such as a cutting tool (e.g., an end mill, a throwaway or disposable insert) and a semiconductor device (e.g., a semiconductor laser, a semiconductor sensor), having a surface which is coated with a diamond coating in the interest of increasing a degree of wear resistance and a degree of surface hardness of the body, as disclosed in JP-B2-59-27753 and JP-B2-2519037. As a method of coating a substrate with a diamond coating, there are proposed various methods such as a microwave plasma CVD (chemical vapor deposition) method, a high-frequency plasma CVD method and an ion beam method.

Where the diamond coating of the diamond-coated body has been worn or damaged as a result of its long service, or where the body is defective due to unsatisfactory formation of the diamond coating in its manufacturing process, it is considered possible to grind the diamond coating so as to remove the diamond coating from the diamond-coated body, so that a substrate of the coated body is reutilized rather than discarded. However, the diamond coating is hard to be ground due to a high degree of hardness thereof, and is accordingly difficult to be removed from the substrate. Consequently, the removal of the diamond coating from the substrate is difficult and time-consuming, even giving rise to a risk of damaging or scratching the substrate of the diamond-coated body.

SUMMARY OF THE INVENTION

It is therefore a first object of the present invention to provide a method of efficiently removing a diamond coating from a substrate of a diamond-coated body in a short time without damaging or scratching the substrate.

It is a second object of the present invention to provide a method of manufacturing a diamond-coated body by reutilizing a substrate from which a diamond coating has been removed.

The first object may be achieved according to a first aspect of this invention, which provides a method of removing a diamond coating from a substrate of a diamond-coated body which includes the substrate coated with the diamond coating, the method comprising a step of heating the diamond-coated body at a predetermined temperature in a furnace or reactor at a predetermined reduced pressure, while introducing an oxygen gas into the reactor at a predetermined flow rate, for burning the diamond coating to thereby remove the diamond coating from the substrate.

According to the present method, the diamond-coated body is heated in the reactor at the predetermined reduced pressure or negative pressure while the oxygen gas is introduced at the predetermined flow rate, so that the diamond coating is burned by the introduced oxygen gas. This method permits the diamond coating to be removed from the substrate without damaging the substrate, more reliably in a shorter time than where the diamond coating is removed by grinding the diamond coating.

According to a first preferred form of the first aspect of the invention, the method further comprises a step of energizing an electromagnetic coil disposed in an outer peripheral portion of the reactor for thereby magnetizing the electromagnetic coil, while the diamond coating is burnt. In this method, the electromagnetic coil disposed in the outer peripheral portion of the reactor is energized or magnetized, so that the oxygen gas is activated owing to an electromagnetic force generated by the energized electromagnetic coil. As a result of the activation of the oxygen gas, the diamond-coated body is bombarded or pressed by oxygen ions (ionized oxygen), so that the burning of the diamond coating is facilitated or accelerated whereby the diamond coating is more satisfactorily removed from the substrate in a further reduced time.

According to a second preferred form of the first aspect of the invention, the predetermined temperature ranges from 600° C. to 1000° C., and the predetermined reduced pressure is not higher than 3000 Pa, and wherein the flow rate ranges from 0.1 L/min to 0.5 L/min. In these ranges of the respective temperature, pressure value and flow rate, the diamond coating is more satisfactorily burned, particularly, where the substrate made of a cemented carbide has been coated with the diamond coating, by using a microwave plasma CVD device. It is more preferable that the predetermined temperature is about 800° C., namely, ranging from 750° C. to 850° C., that the predetermined reduced pressure is not higher than 1000 Pa, and that the flow rate is about 0.2 L/min, namely, ranging from 0.15 L/min to 0.25 L/min. It is to be understood that there is not a particular lower limit of the reduced pressure value in the reactor although the lower limit is preferably close to the absolute vacuum. For example, the lower limit may be determined depending upon the capacity of the used device, in such a range that the lower limit is not higher than about 100 Pa. It is also to be understood that the above-described temperature is interpreted to be a temperature at a surface of the diamond coating when the diamond coating is burnt, which temperature is measured by a radiation thermometer (emission thermometer).

According to a third preferred form of the first aspect of the invention, the reactor is provided by a microwave plasma CVD device, namely, the reactor consists of a reactor of the microwave plasma CVD device, so that the diamond-coated body is heated by a microwave. In this method, the diamond-coated body is heated by using the reactor of the microwave plasma CVD device which has been conventionally used in an operation for coating a substrate with a diamond coating. Thus, the diamond coating is more easily removed from the substrate at a further reduced cost, by utilizing such a conventional device.

The above-described second object may be achieved according to a second aspect of this invention, which provides a method of manufacturing a new diamond-coated body, by reutilizing a substrate of a diamond-coated body which includes the substrate coated with a diamond coating, the method comprising: (a) a removing step of removing the diamond coating from the substrate of the diamond-coated body, by burning the diamond coating; and (b) a coating step of coating a surface of the substrate, with a new diamond coating, for thereby obtaining the new diamond-coated body.

According to the present method, where the diamond coating of the diamond-coated body has been worn or damaged, or where the body is defective due to unsatisfactory formation of the diamond coating in its manufacturing process, the substrate of the diamond-coated body is recycled or reutilized, without newly preparing another substrate, for manufacturing a new diamond-coated body. That is, the substrate, from which the diamond coating has been burned out or removed, is recoated with a diamond coating, so as to produce the new diamond-coated body. The thus effective utilization of the existing substrate advantageously provides an increased yield ratio and a reduced manufacturing cost. The present method has another advantage that a desired diamond-coated body can be produced more efficiently than where the diamond-coated body is produced by using a newly prepared substrate. Further, by burning the diamond coating, the removal of the diamond coating can be completed without damaging the substrate, more reliably in a further reduced time, than where the diamond coating is removed by grinding. It is noted that the coating step may be interpreted as a recoating step of recoating the surface of the substrate with the diamond coating.

According to a first preferred form of the second aspect of the invention, the diamond coating is removed in accordance with the method defined in the first aspect of the invention. This method of the first preferred form of the second aspect provides the same advantageous effect as the above-described method of the first aspect of the invention.

According to a second preferred form of the second aspect of the invention, the desired diamond-coated body consists of a diamond-coated tool which has the substrate in the form of a tool substrate whose surface is coated with the diamond coating. This preferred form of the second aspect of the invention relates to a method of manufacturing the diamond-coated tool, in which the tool substrate is effectively utilized, resulting in a reduced cost for manufacturing the diamond-coated tool.

The diamond-coated tool may be, for example, an end mill or other cutting tool having a cutting edge formed on the tool substrate.

According to a third preferred form of the second aspect of the invention, the desired diamond-coated body consists of a diamond-coated semiconductor device which has the substrate in the form of a semiconductor device whose surface is coated with the diamond coating. This preferred form of the second aspect of the invention relates to a method of manufacturing the diamond-coated semiconductor device, in which the semiconductor device as the substrate is effectively utilized resulting in a reduced cost for manufacturing the diamond-coated semiconductor device.

The present invention is applicable to the diamond-coated tool, the diamond-coated semiconductor device or any other kind of diamond-coated bodies having respective substrates each of which does not have a risk of being damaged by the burning of the diamond coating.

In the practice of the method of the present invention, in which the diamond coating is burnt out by oxygen so as to be removed from the substrate, in general, burnt residues including impurities tend to remain sticking to the surface of the substrate, after the diamond coating has been burnt out by oxygen. In view of this tendency, the method may further include a step of wiping the surface of the substrate with a cloth containing fine abrasive grains, so as to remove the burnt residues from the surface. Particularly, in the practice of the method of the second aspect of the invention, in which the surface of the substrate is recoated with the diamond coating after the removal of the diamond coating from the substrate, it is preferable that the diamond coating is removed from the surface of the substrate as completely as possible.

In the method of the second preferred form of the first aspect of the invention, the temperature at which the diamond-coated body is heated ranges from 600° C. to 1000° C., the pressure value in the reactor is held not higher than 3000 Pa, and the flow rate at which the oxygen gas is introduced into the reactor ranges from 0.1 L/min to 0.5 L/min. However, the thus specified burning condition does not have to be necessarily applied to the removal of any kind of diamond-coated bodies, but may be suitably modified depending upon the coating method of the diamond coating, the material of the substrate and other factors.

Where the diamond coating is burnt in the burning condition specified in the second preferred form of the first aspect of the invention, the diamond coating can be burnt out in about 20–30 minutes. However, the burning time may be suitably changed depending upon, for example, the thickness of the diamond coating, the area of the diamond coating, and the number of the diamond-coated bodies which are simultaneously heated.

In the third preferred form of the first aspect of the invention, the microwave plasma CVD device is used so that the diamond-coated body is heated by the microwave. However, the used reactor may be any one of other devices which are designed for forming a diamond coating, or even any one of devices which are not designed for forming a diamond coating. Further, it is possible to employ a resistance heating or other heating method depending upon, for example, the material of the substrate, as long as the heating method makes it possible to raise the temperature at the surface of the diamond coating to about 600–1000° C.

The coating step defined in the second aspect of the invention is preferably implemented with the microwave plasma CVD device in accordance with a microwave plasma CVD method. However, the coating step may be implemented in accordance with any other methods such as a high-frequency plasma CVD method and an ion beam method. Further, the method of the third preferred form of the first aspect of the invention in which the diamond-coated body is heated by the microwave in the microwave plasma CVD device can be applied not only where the substrate has been coated with the diamond coating in accordance with the microwave plasma CVD method but also where the substrate has been coated with the diamond coating in accordance with a method other than the microwave plasma CVD method.

The diamond-coated tool defined in the second preferred form of the second aspect of the invention may interpreted to mean an end mill, a drill, a tap, a threading die, a disposable or throwaway insert or other cutting tool having at least one cutting edge formed on its substrate, or a cold-forming tap, a cold-forming die or other cold-forming tool which is designed to form the workpiece into a desired shape by plastically deforming the workpiece. The tool substrate is preferably made of a cemented carbide, but may be made of a cermet, a ceramic or other material. Where the diamond-coated tool is coated with a new diamond coating after the removal of an old diamond coating, the cutting edge may be reground, as needed, so as to restore its original shape before the tool is coated with the new diamond coating.

The diamond-coated semiconductor device defined in the third preferred form of the second aspect of the invention may be interpreted to mean any one of various kinds of semiconductor sensors, semiconductor torsion gages, semiconductor storage elements, semiconductor switching elements, semiconductor lasers and other semiconductor devices each of which is provided by a semiconductor. As the semiconductor sensors, there are a photo sensor (e.g., a photodiode and a phototransistor) which utilizes a photoelectric effect, a displacement sensor which utilizes a magneto-resistance effect, a thermistor which utilizes a temperature dependency of an electric resistance, a pressure sensor which utilizes a piezo-electric effect, a magnetic sensor which utilizes the Hall effect, and a gas sensor which utilizes a variation in an electric resistance caused by a gas absorption.

BRIEF DESCRIPTION OF THE DRAWINGS

The above and other objects, features, advantages and technical and industrial significance of this invention will be better understood by reading the following detailed description of the presently preferred embodiment of the invention, when considered in connection with the accompanying drawings, in which.

DETAILED DESCRIPTION OF THE EMBODIMENT

Figure 1:
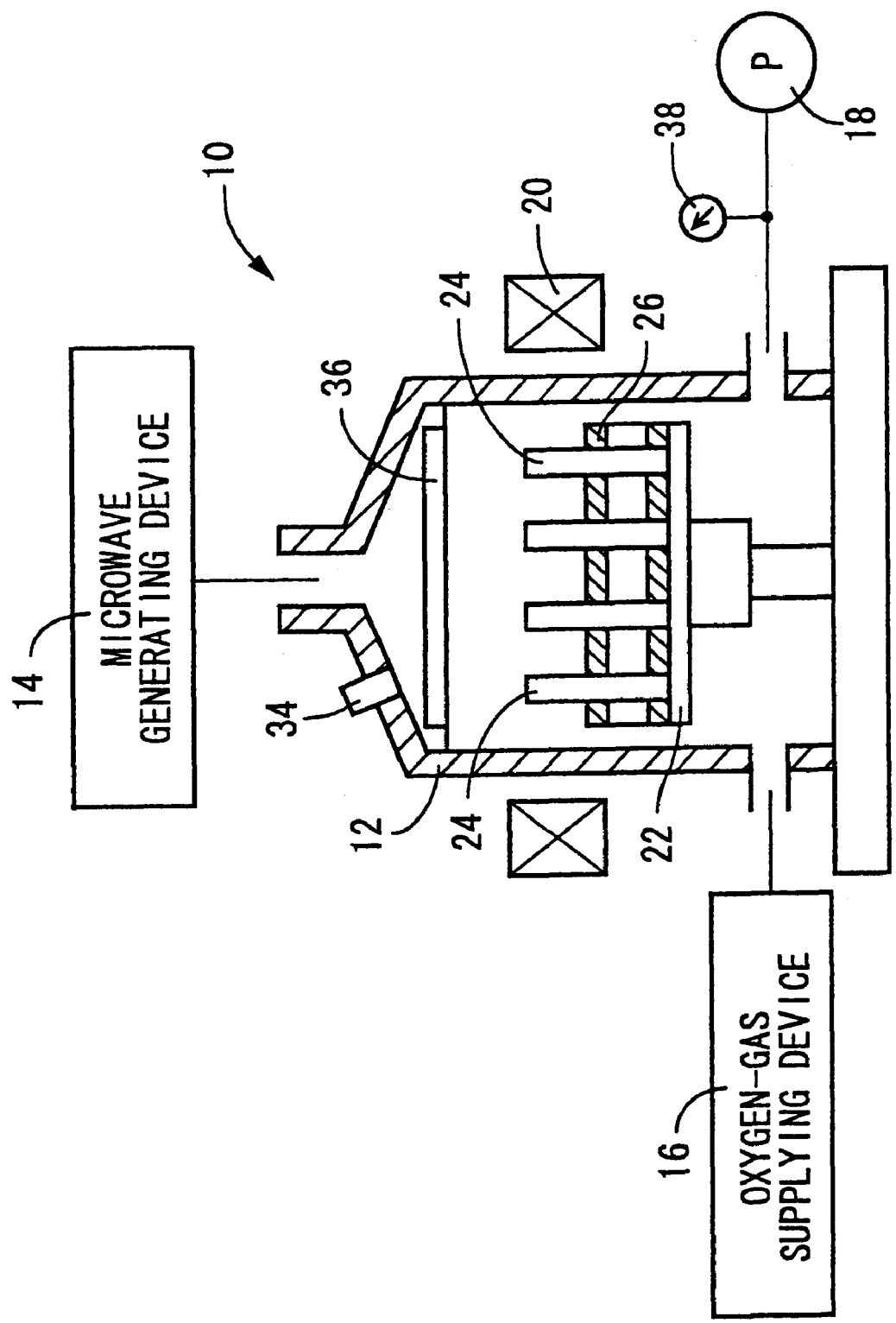
FIG. 1 is a view schematically showing a diamond-coating removing device with which a method of the present invention is advantageously carried out.

FIG. 1 is a view schematically shows a diamond-coating removing device 10 which is capable of burning a diamond coating of a diamond-coated tool and removing the diamond coating from the diamond-coated tool according to a method of the present invention. The diamond-coating removing device 10 may be a microwave plasma CVD device, so that the diamond-coating removing device 10 can be used for selectively burning and forming the diamond coating by changing the kind of gas supplied to the removing device 10. The diamond-coating removing device 10 includes a tubular furnace or reactor 12, a microwave generating device 14, a gaseous-oxygen supplying device 16, a vacuum pump 18 and an electromagnetic coil 20. The removing device 10 further includes a table 22 which is disposed in the tubular reactor 12, and a supporting member 26 which is disposed on the table 22. The supporting member 26 is designed to support a plurality of diamond-coated bodies in the form of diamond-coated tools 24 from each of which the diamond coating is to be removed.

Figure 2:
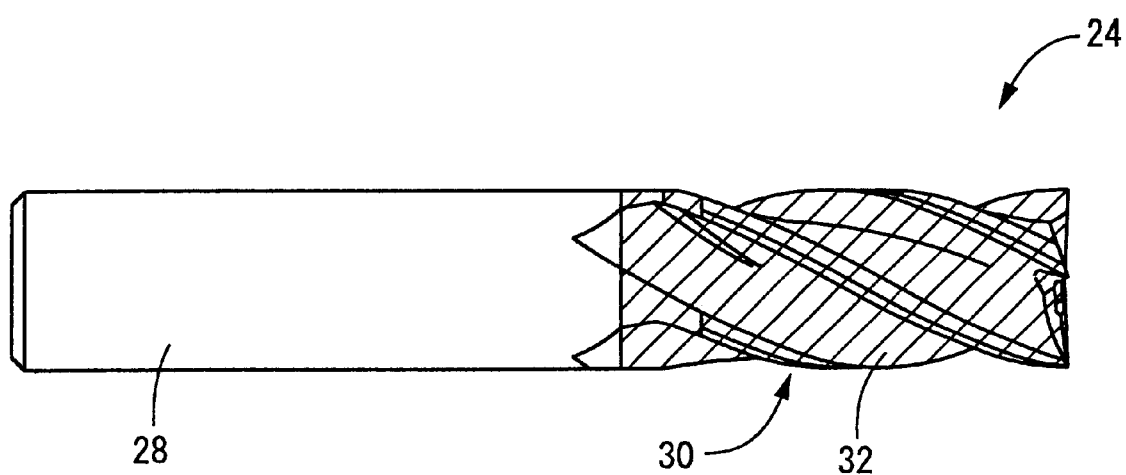
FIG. 2 is a front view showing a diamond-coated tool from which a diamond coating is removed in accordance with the method of the invention, by using the device of FIG. 1.

FIG. 2 shows one of the diamond-coated tools 24 in the form of an end mill which includes a tool substrate (base material) 28 made of a cemented carbide. The tool substrate 28 includes a shank portion and a cutting-edge portion 30 which are formed integrally with each other. The cutting-edge portion 30, in which peripheral cutting edges and bottom cutting edges are formed, has a surface that is coated with a diamond coating 32 by using a coating device such as the microwave plasma CVD device. In FIG. 2, the oblique-lined portion represents a portion of the surface on which the diamond coating 32 is coated. Each of the diamond-coated tools 24 is held by the supporting member 26 such that the cutting-edge portion 30 coated with the diamond coating 32 is positioned upwardly of the shank portion. These diamond-coated tools 24 are used products in each of which the diamond coating 32 has been worn or damaged as a result of its long-time service, or defective products in each of which the diamond coating 32 has not been satisfactorily applied onto the surface in the manufacturing process. It is noted that the supporting member 26 is made of a stainless-steel.

Referring back to FIG. 1, the microwave generating device 14 is adapted to generate, for example, a microwave having a frequency of about 2.45 GHz. The diamond-coated tool 24 is heated with introduction of the microwave into the reactor 12, and a temperature at the surface of the cutting-edge portion 30 of the heated diamond-coated tool 24 is detected by a radiation thermometer 34 which is provided in the reactor 12. An electric power supplied to the microwave generating device 14 is controlled in a feedback manner, i.e., on the basis of a signal representative of the detected temperature, such that the detected temperature coincides with a predetermined temperature. A back flow of the microwave is prevented by a reflecting mirror 36 which is disposed in an upper portion in the reactor 12.

The gaseous-oxygen supplying device 16 includes a gas cylinder which is filled with the oxygen gas, a flow control valve which serves to control a flow rate of the oxygen gas, and a flowmeter which serves to measure the flow rate of the oxygen gas. The gaseous-oxygen supplying device 16 supplies the oxygen gas to the interior of the tubular reactor 12 at a predetermined flow rate. The vacuum pump 18 serves to reduce the pressure in the interior of the reactor 12, by sucking the gas in the interior of the reactor 12. An electric current supplied to the a motor of the vacuum pump 18 is controlled in a feedback manner such that an actual value of the pressure detected by a pressure gage 38 coincides with a predetermined value. The electromagnetic coil 20 consists of an annular mass which is positioned radially outwardly of the tubular reactor 12 so as to surround the outer circumferential surface of the reactor 12. The oxygen gas is activated by an electromagnetic force which is generated upon magnetization of the electromagnetic coil 20 with an electric current supplied to the coil 20. As a result of the activation of the oxygen gas, oxygen ions (ionized oxygen) is forced downwardly and then pressed onto the surface of the diamond-coated tool 24.

Figure 3:
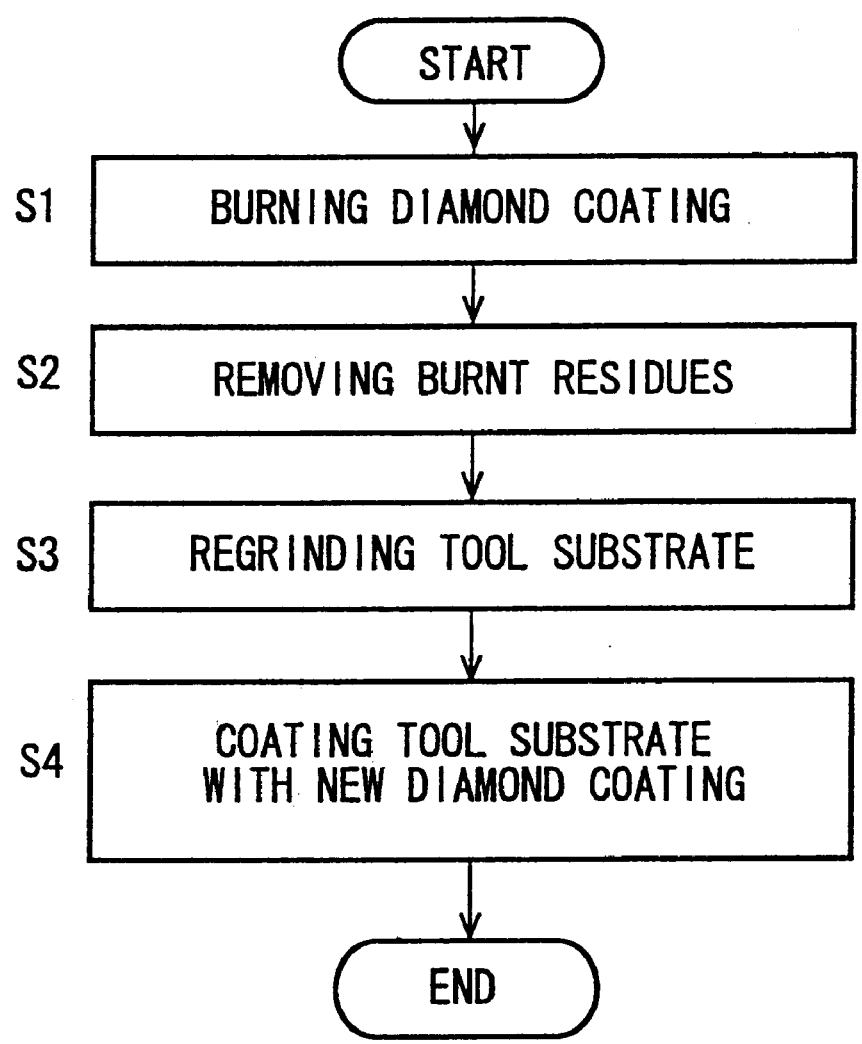
FIG. 3 is a flow chart illustrating a procedure for manufacturing a diamond-coated tool, in which the diamond coating is removed from a tool substrate of the diamond-coated tool of FIG. 2 so that the tool substrate is reutilized to be coated with a new diamond coating.
Figure 4:
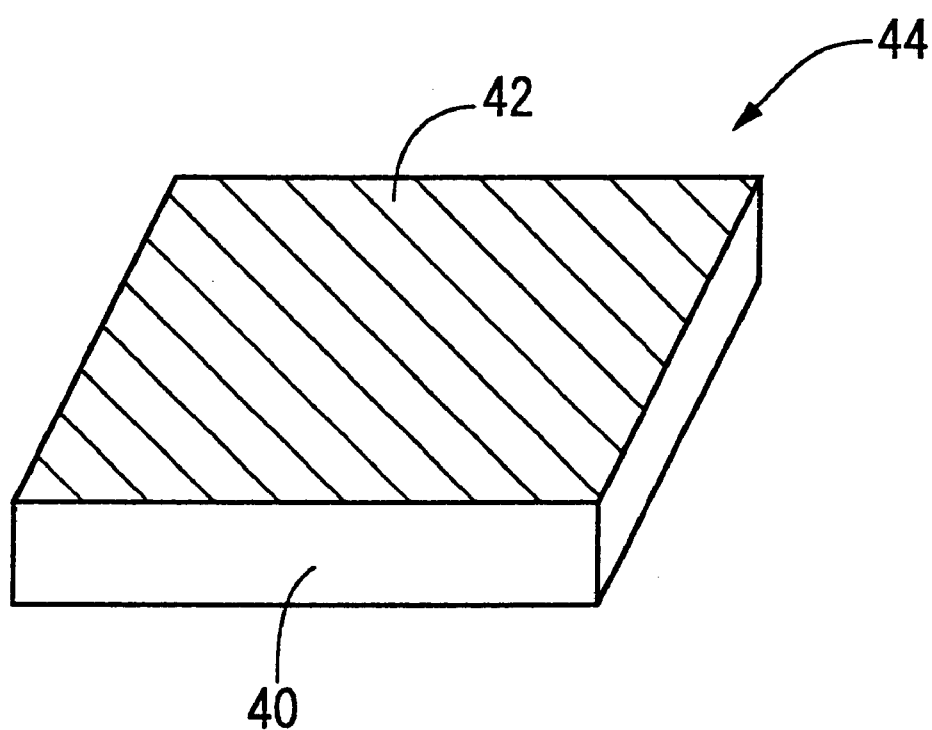
FIG. 4 is a perspective view showing a diamond-coated semiconductor device to which the method of the invention is advantageously applied.

After the diamond coating 32 has been removed from the tool substrate 28 by using the diamond-coating removing device 10 constructed as described above, the tool substrate 28 is recoated with a new diamond coating 32 for obtaining a new diamond-coated tool 24, according to a method whose procedure will be described in detail by reference to the flow chart of FIG. 3.

The procedure is initiated with step S1 in which the diamond coating 32 covering or coating the cutting-edge portion 30 of the diamond-coated tool 24 is burned by the diamond-coating removing device 10, so that the diamond coating 32 is removed from the tool substrate 28 as completely as possible. Described more specifically, after the diamond-coated tool 24 has been introduced into the supporting member 26 which is disposed within the tubular reactor 12, the diamond-coated tool 24 is heated by the microwave generating device 14 such that the temperature at the cutting-edge portion 30 of the diamond-coated tool 24 rises to about 800° C. The pressure within the tubular reactor 12 is reduced to about 930 Pa by the vacuum pump 18, while the oxygen gas is introduced into the reactor 12 at a flow rate of 0.2 L/min by the gaseous-oxygen supplying device 16. The electromagnetic coil 20 is energized or magnetized with application of the electric current to the coil 20, so that the diamond coating 32 reacts with the oxygen so as to be burned. The diamond coating 32 is kept burned for 20–30 min. This step S1 corresponds to a removing step, which is defined in the above-described second aspect of the invention.

Step S1 is followed by step S2 implemented to remove impurities, i.e., burnt residues sticking to the surface of the cutting-edge portion 30 of the tool substrate 28 on which the diamond coating 32 has been burnt out in step S1. That is, in step S2, the tool substrate 28 is taken out of the reactor 12, and the burnt residues are removed by wiping the surface of the cutting-edge portion 30 with a cloth or fabric containing fine abrasive grains. Step S3 is then implemented to regrind the cutting edges formed in the cutting-edge portion 30 of the tool substrate 28, as needed, for example, where the cutting edges are worn or chipped as a result of its service.

Step 3 is followed by step S4 in which the surface of the cutting-edge portion 30 of the tool substrate 28 is coated with a new diamond coating 32, in accordance with a microwave plasma CVD (chemical vapor deposition) method, a high-frequency plasma CVD method, an ion beam method or other coating methods. The diamond-coating removing device 10 can be used to coat the cutting-edge portion 30 with the new diamond coating 32 in accordance with the microwave plasma CVD method. In this instance, the gaseous-oxygen supplying device 16 may be adapted to supply a material gas such as methane ($CH_4$), hydrogen ($H_2$) and carbon monoxide (CO), in stead of the oxygen gas, into the tubular reactor 12. A flow rate of the material gas, a pressure within the tubular reactor 12 and a temperature of the heated tool substrate 28 during the implementation of step S4 are suitably determined. With the implementation of step S4, the surface of the cutting-edge portion 30 is coated with the new diamond coating 32, whereby a new diamond-coated tool 24 is provided. This step S4 corresponds to a coating step, which is defined in the above-described second aspect of the invention.

As is clear from the foregoing description, in the present embodiment, where the diamond coating 32 of the diamond-coated tool 24 has been worn or damaged as a result of its long-time service, or where the tool 24 is defective due to unsatisfactory formation of the diamond coating 32 in a coating operation process, the tool substrate 28 of the tool 24 is recycled or reutilized, in stead of preparing a new tool substrate 28, for manufacturing a new diamond-coated tool 24. That is, the tool substrate 28, from which the diamond coating 32 has been burned out or removed, is recoated with the diamond coating 32, so as to provide the new diamond-coated tool 24. The thus effective utilization of the existing tool substrate 28 advantageously provides an increased yield ratio and a reduced manufacturing cost.

The method of the present embodiment has another advantage that the new diamond-coated tool 24 can be produced more rapidly than where a new tool substrate 28 is prepared to produce the new diamond-coated tool 24. Thus, it is possible to prevent a delayed delivery of the product to the user due to the unsatisfactory coating in the manufacturing process, and accordingly making unnecessary for manufacturing spare products in view of possible appearances of defective products in the manufacturing process. In this respect, too, the present method remarkably contributes to a reduction in the manufacturing cost.

In the present embodiment, in which the diamond coating 32 is removed by burning out the diamond coating 32, the removal of the diamond coating 32 can be completed without damaging the tool substrate 28, more reliably in a further reduced time than where the diamond coating is removed by grinding the diamond coating. The complete removal of the diamond coating 32 from the tool substrate 28 facilitates a satisfactory coating of the tool substrate 28 with the new diamond coating 32.

In the present embodiment, the removing step S1 is implemented such that the diamond-coated tool 24 is heated at the temperature of about 800° C. in the reactor 12 in which the pressure is reduced to about 930 Pa while the oxygen gas is introduced into the reactor 12 at the flow rate of 0.2 L/min. In this burning condition, the diamond coating 32 is satisfactorily burnt out.

In the present embodiment, the electromagnetic coil 20 disposed in the outer peripheral portion of the reactor 12 is magnetized, so that the oxygen gas is activated owing to an electromagnetic force generated by the magnetization of the electromagnetic coil 20. As a result of the activation of the oxygen gas, the diamond-coated tool 24 is bombarded or pressed by oxygen ions (ionized oxygen), so that the burning of the diamond coating 32 is facilitated or accelerated, whereby the diamond coating 32 is more satisfactorily removed from the tool substrate 28 in a further reduced time.

In the present embodiment, the diamond-coating removing device 10 is provided by the microwave plasma CVD device which has been conventionally used in an operation for coating a substrate with a diamond coating, so that the diamond-coating tool 24 is heated by a microwave. Thus, the diamond coating 32 is more easily removed from the substrate in a further reduced cost, by utilizing such a conventional device.

While the presently preferred embodiment of the present invention have been described above with a certain degree of particularity, by reference to the accompanying drawings, it is to be understood that the invention is not limited to the details of the illustrated embodiment, but may be otherwise embodied.

In the above-illustrated embodiment, the diamond coating 32 of the diamond-coated tool 24 is burnt to be removed from the tool substrate 28, and the tool substrate 28 is then utilized to be coated with the new diamond coating 32, for thereby providing the new diamond-coated tool 24. However, the present invention is applicable also to a diamond-coated semiconductor device 44 in which a diamond coating 42 is provided to cover or coat a surface of a semiconductor device 40 such as a semiconductor laser and a semiconductor sensor. The diamond coating 42 of the diamond-coated semiconductor device 44 is burnt in the same burning condition as in the above-illustrated embodiment, by using the diamond-coating removing device 10. After the diamond coating 42 has been removed from the semiconductor device 40 by burning out the diamond coating 42, the semiconductor device 40 is reutilized to be coated with a new diamond coating 42, for thereby providing a new diamond-coated semiconductor device 44. In this process of manufacturing the new diamond-coated semiconductor device 44, the regrinding step S3 is not necessary to be implemented. It is noted that the diamond-coated semiconductor device 44 and the semiconductor device 40 correspond to the diamond-coated body and the substrate, respectively.

It is to be understood that the invention may be embodied with various other changes, modifications and improvements, which may occur to those skilled in the art, without departing from the spirit and scope of the invention defined in the following claims.

What is claimed is:

1. A method of removing a diamond coating from a substrate of a diamond-coated body, said method comprising:

a step of heating said diamond-coated body at a predetermined temperature in a reactor at a predetermined reduced pressure, while introducing an oxygen gas into said reactor at a predetermined flow rate, for burning said diamond coating to thereby remove said diamond coating from said substrate.

2. A method according to claim 1, further comprising a step of energizing an electromagnetic coil disposed in an outer peripheral portion of said reactor for thereby magnetizing said electromagnetic coil, while said diamond coating is burnt.

3. A method according to claim 1, wherein said predetermined temperature ranges from 600° C. to 1000° C., and said predetermined reduced pressure is not higher than 3000 Pa, and wherein said flow rate ranges from 0.1 L/min to 0.5 L/min.

4. A method according to claim 1, wherein said reactor is provided by a microwave plasma CVD operable to heat said diamond-coated body with a microwave.

5. A method of manufacturing a new diamond-coated body, by reutilizing a substrate of a diamond-coated body, which substrate is coated with a diamond coating, said method comprising:

a removing step of removing said diamond coating from said substrate of said diamond-coated body, by burning said diamond coating; and a coating step of coating a surface of said substrate with a new diamond coating, for thereby obtaining said new diamond-coated body.

6. A method according to claim 5, wherein said diamond coating is removed from said substrate in accordance with the method of removing a diamond coating from a substrate of a diamond-coated body, said method comprising: a step of heating said diamond-coated body at a predetermined temperature in a reactor at a predetermined reduced pressure, while introducing an oxygen gas into said reactor at a predetermined flow rate, for burning said diamond coating to thereby remove said diamond coating from said substrate.

7. A method according to claim 5, wherein said new diamond-coated body consists of a diamond-coated tool which has said substrate in the form of a tool substrate whose surface is coated with said diamond coating.

8. A method according claim 7, wherein said diamond-coated tool consists of a cutting tool having a cutting edge formed on said tool substrate.

9. A method according to claim 8, wherein said cutting tool consists of an end mill.

10. A method according to claim 5, wherein said new diamond-coated body consists of a diamond-coated semiconductor device which has said substrate in the form of a semiconductor device whose surface is coated with said diamond coating.

* * * * *